US00RE37554E

(19) United States
(12) Reissued Patent
Brunner et al.

(10) Patent Number: US RE37,554 E
(45) Date of Reissued Patent: Feb. 19, 2002

(54) METHOD FOR PRODUCING AN OPTOELECTRONIC SEMICONDUCTOR COMPONENT

(75) Inventors: Herbert Brunner; Heinz Haas; Günter Waitl, all of Regensburg (DE)

(73) Assignee: Siemens Aktiengesellschaft, Munich (DE)

(21) Appl. No.: 09/776,462

(22) Filed: Oct. 25, 2000

Related U.S. Patent Documents

Reissue of:
(64) Patent No.: 5,985,696
Issued: Nov. 16, 1999
Appl. No.: 09/048,561
Filed: Mar. 26, 1998

U.S. Applications:
(63) Continuation of application No. PCT/DE96/01728, filed on Sep. 13, 1996.

(30) Foreign Application Priority Data

Sep. 26, 1995 (DE) ..... 195 35 777

(51) Int. Cl.[7] ..... H01L 21/44; H01L 21/48; H01L 21/50; H01L 27/15

(52) U.S. Cl. ..... 438/116; 438/127; 438/126; 257/81

(58) Field of Search ..... 438/116, 127, 438/126, 125, 106; 257/81

(56) References Cited

U.S. PATENT DOCUMENTS

| | | | | | |
|---|---|---|---|---|---|
| 3,820,237 | A | * | 6/1974 | Effer | 29/588 |
| 3,887,803 | A | * | 6/1975 | Savage, Jr. | 240/151 |
| 4,959,761 | A | * | 9/1990 | Critelli et al. | 362/226 |
| 5,321,305 | A | * | 6/1994 | Sakamoto | 257/666 |
| 5,349,509 | A | * | 9/1994 | Klug | 362/362 |
| 5,382,810 | A | * | 1/1995 | Isaksson | 257/81 |
| 5,763,901 | A | * | 6/1998 | Komoto et al. | 257/99 |

FOREIGN PATENT DOCUMENTS

| | | | | |
|---|---|---|---|---|
| DE | 2733937 | * | 2/1979 | G08C/17/00 |
| DE | 4232644 A1 | * | 3/1994 | |
| GB | 2098002 A | * | 11/1982 | |

OTHER PUBLICATIONS

Japanese Patent Abstract No. 62105486 Yuzo), dated May 15, 1987.*
Japanese Patent Abstract No. 1–69061 (Araki), dated Mar. 15, 1989.*
Japanese Patent Abstract No. 03254162 (Masaharu et al.), dated Nov. 13, 1991.*
Japanese Patent Abstract No. 62139367 (Kengo et al.), dated Jun. 23, 1987.*

* cited by examiner

*Primary Examiner*—Wael Fahmy
*Assistant Examiner*—Neal Berezny
(74) *Attorney, Agent, or Firm*—Herbert L. Lerner; Laurence A. Greenberg; Werner H. Stemer

(57) ABSTRACT

The optoelectronic semiconductor component has an optoelectronic semiconductor chip disposed on a chip carrier with an approximately planar chip carrier surface. The semiconductor chip is fastened with predetermined alignment of its optical axis. A plastic base part supports the chip carrier. The semiconductor chip is electrically conductively connected to at least two electrode terminals routed through the base part, and a lens is disposed above the semiconductor chip on top of the base part. The lens is formed with an independently configured cap produced from plastic material. The cap is mechanically form-locked to a support of the base part. When the cap is placed onto the base part, a holder of the cap and the support engage with one another. The holder and the support are configured such that when the cap is placed onto the base part, the two parts are automatically positioned with respect to one another in such a way that the optical axes of the lens and of the semiconductor chip coincide.

20 Claims, 3 Drawing Sheets

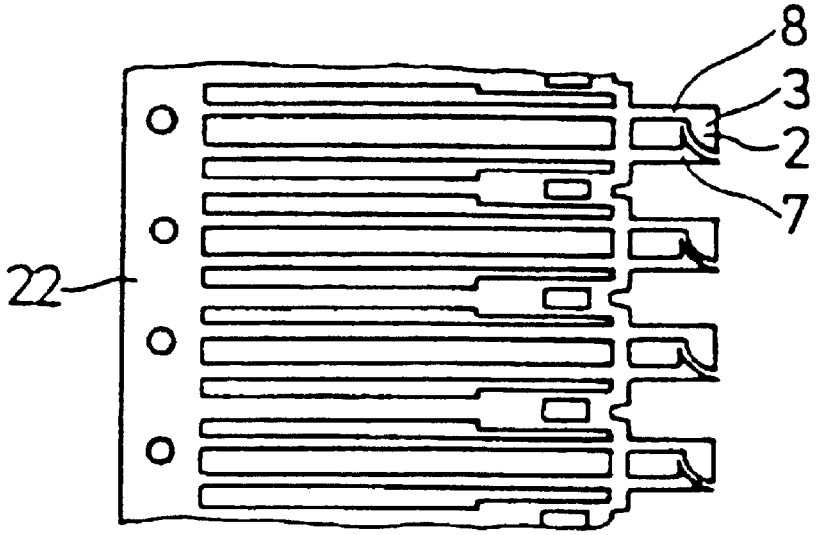
Fig 4
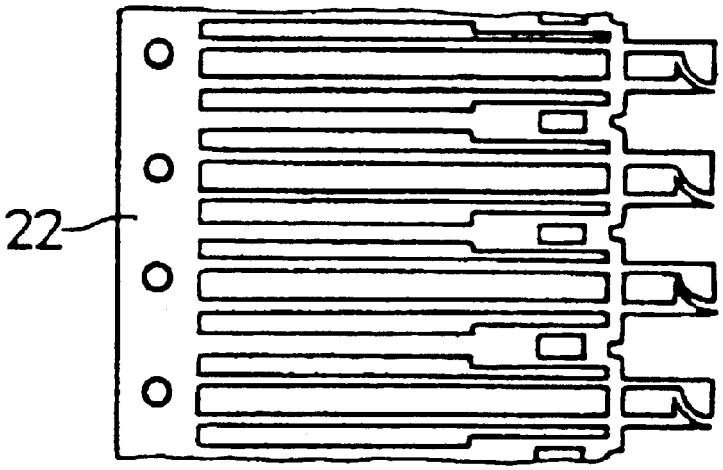

METHOD FOR PRODUCING AN OPTOELECTRONIC SEMICONDUCTOR COMPONENT

Matter enclosed in heavy brackets [ ] appears in the original patent but forms no part of this reissue specification; matter printed in italics indicates the additions made by reissue.

CROSS-REFERENCE TO RELATED APPLICATION

This application is a continuation of copending international application PCT/DE96/01728, filed Sep. 13, 1996, which designated the United States.

BACKGROUND OF THE INVENTION

Field of the Invention

The invention relates to optoelectronic semiconductor components. More particularly, the invention pertains to a method for producing an optoelectronic semiconductor component, specifically for applications having very narrow radiation and/or reception characteristics. The components comprise a chip carrier, which has an approximately planar chip carrier surface and on which an optoelectronic semiconductor chip is fastened with predetermined alignment of its optical axis, and a base part, which is assigned to the chip carrier, supports the latter and is produced from a plastic material, the semiconductor chip being electrically conductively connected to at least two electrode terminals routed through the base part, and the semiconductor chip being assigned a lens, which covers over the base part.

Prior art optoelectronic semiconductor components, in particular those which are subject to increased demands with regard to their optical properties, have largely been produced in metal-glass housings. There, the chip carriers are, usually, baseplates produced from metal mounted with a metal cap with a glass lens fitted in. Due to the mounting by means of a metal housing, it has been possible, on the one hand, to ensure a hermetically sealed closure of the housing and, on the other hand, to provide suitability of the optoelectronic semiconductor component for specific high-temperature applications starting from about 150° C. The ageing of the semiconductor chip given such a type of mounting was slight since, on account of the metal housing type used, there was essentially no loading on the semiconductor chip on account of directly surrounding material. Finally, it has been possible to configure the optical properties of the semiconductor component favorably on account of the glass lens fitted into the metal cap.

The considerable costs necessarily incurred by the relatively complicated production are regarded as a significant disadvantage of the optoelectronic semiconductor components that have been produced to date. In this case, the metal cap with a glass lens fitted in, which requires a high production outlay, has a particular impact. Furthermore, the semiconductor components mounted in metal-glass housings have problems on account of the adjustment and manufacturing tolerances that must be estimated to be relatively large, with the result that such optoelectronic semiconductor components generally have relatively unfavorable squint angles. These are production-dictated deviations of the optical axis from the mechanical axis of the component. As a result, such semiconductor components can only be used to a limited extent in applications which involve narrow radiation and/or reception characteristics. In the prior art optoelectronic semiconductor components, a larger adjustment play during mounting consequently has an extremely unfavorable effect on the squint angle obtained, given closer tolerance specifications.

Furthermore, mass-produced plastic light-emitting diodes having lesser requirements with regard to the optical qualities are known in which the housing with a baseplate and a cap is cast in one process operation and thus produced in one part. That production process is significantly less expensive than metal-glass housings. However, as a result of the single work operation of the (pressureless) casting production, excessively high adjustment tolerances and thus high squint angles are produced. The optoelectronic semiconductor components produced in such a way have quite unsatisfactory optical properties for specific applications.

There have become known, as disclosed in Patent Abstracts of Japan, Vol. 16, No. 055 (E-1165), Feb. 12, 1992, & JP-A-03254162, a light-emitting diode with a base part made of metal and a plastic cap with a lens part. There, the object is to improve the positioning accuracy and to increase the emission rate.

Reference is also had to Patent Abstracts of Japan, Vol. 11, No. 367 (E-561), Nov. 28, 1987 & JP-A-62139367 and Patent Abstracts of Japan, Vol. 11, No. 312 (E-548), Oct. 12, 1987 & JP-A-62105486, which show further light-emitting diodes with separately configured lens caps.

SUMMARY OF THE INVENTION

It is accordingly an object of the invention to provide a method of producing an optoelectronic semiconductor component, which overcomes the above-mentioned disadvantages of the prior art methods of this general type and which provides for a component that, given high requirements on the adjustment tolerances and thus squint angles, can be produced considerably more cost-effectively as compared to the prior art.

With the foregoing and other objects in view there is provided, in accordance with the invention, a method of producing an optoelectronic semiconductor component, in particular such a component with very narrow radiation and/or reception characteristics. The method comprises:

providing a chip carrier strip with a multiplicity of successively arranged chip carriers each having a substantially planar chip carrier surface, injection-molding a base part around an individual chip carrier of the multiplicity of chip carriers on the chip carrier strip and at least two electrode terminals extending through the base part;

fastening an optoelectronic semiconductor chip with a given optical axis on the chip carrier surface of the chip carrier;

contacting the optoelectronic semiconductor chip with the at least two electrode terminals extending through the base part;

providing an independent cap produced from plastic material and having a lens with an optical axis, and placing the independent cap on the base part such that the cap and the base part are automatically positioned with respect to one another such that the optical axis of the lens and the optical axis of the semiconductor chip substantially coincide; and permanently fastening the cap to the base part.

In accordance with an added feature of the invention, the step of providing the independent cap comprises producing the cap as a separate structural part in an injection molding operation.

In accordance with an additional feature of the invention, a lens covering is produced between the base part and the cap, the lens covering the semiconductor chip.

In accordance with another feature of the invention, an individual optoelectronic semiconductor component is separated from the chip carrier strip only subsequently to the steps of injection-molding, fastening the semiconductor chip on the chip carrier surface, and contacting the semiconductor chip with the electrode terminals.

In accordance with a further feature of the invention, the cap is provided with a holding means and the holding means is positively locked (form-locked) to a support of the base part by placing the cap onto the base part and mutually engaging the holding means and the support, and forming the holding means and the support such that when the cap is placed onto the base part the optical axes of the lens and the semiconductor chip are automatically aligned with one another.

In other words, the objects of the invention are satisfied in that the independently configured cap produced from plastic material is produced as a separate structural part by means of an injection molding operation. The base part is produced in an injection molding operation of a chip carrier from a multiplicity of chip carriers arranged successively in a chip carrier strip. An optoelectronic semiconductor component is separated from the chip carrier strip only after the base part has been produced, after the semiconductor chip has been fastened on the chip carrier surface by means of bonding, and after the semiconductor chip has been contacted with the electrode terminals. The carrier strip encapsulated by injection molding may be produced and processed in an endless manner, so-called reel-to-reel technique. Overall, it is possible in this way to realize cost-effective mounting of the component with very close electro-optical parameter tolerances.

In accordance with a preferred embodiment of the invention, the lens covering the base part is a part of an independently configured cap produced from plastic material, the cap having a holding means for a positively locking mechanical connection to a support of the base part, in such a way that when the cap is placed onto the base part, the holding means and the support alternately engage with one another. The holding means and the support are configured in such a way that when the cap is placed onto the base part, the cap and the base part are automatically positioned with respect to one another such that the optical axes of the lens and of the semiconductor chip coincide at least approximately.

Due to the fact that the base part supporting the chip carrier and the cap with the integrated lens (with the cap placed onto the base part) are produced as two separate plastic structural parts each produced by injection molding, it is possible to produce an optoelectronic semiconductor component significantly more cost-effectively. In fact, the cost savings is by approximately a factor of 10, compared with the prior art components, without accepting losses in the optical properties of the semiconductor component. The two separately produced structural parts can be joined to one another automatically in an substantially play-free manner, with the result that the semiconductor component according to the invention has only extremely small adjustment tolerances and thus extremely small squint angles. The optoelectronic semiconductor component according to the invention is therefore outstandingly suitable for applications having very narrow radiation and/or reception characteristics. The production of the lens, integrated in the cap, from plastic furthermore enables lens shapes which can be produced significantly more accurately than glass lenses, and therefore better optical properties of the lens. The effect that can be achieved by means of a suitable configuration of cap and base part is that when the cap is placed onto the base part, they are automatically positioned and/or centered with respect to one another.

In accordance with again an added feature of the invention, the cap and the base part are cylindrically symmetrical. Their axes of symmetry run concentrically with respect to one another and each coincide with the optical axes of lens and semiconductor chip. Furthermore, the holding means of the cap and the support of the base part are adapted and/or designed for a positively locking connection. In accordance with again a further feature of the invention, the holding means and the support are designed in such a way that when the cap and the base part are joined, they are automatically positioned with respect to one another in such a way as to ensure stable and substantially play-free symmetrical positioning of the cap and the base part.

In accordance with yet another feature of the invention, the cap and the base part are mechanically alignment by forming the support of the base part, on its outer circumference, with a peripheral abutment surface, which supports the holding means of the cap (when the cap is placed on the base part).

The holding means and support which are assigned to the positively locking mechanical connection of cap and base part, which connection can be released in the axial direction, are formed by projections and grooved recesses which are formed alternately and peripherally on both parts. Alternatively, the holding means and support, for mutual alignment of cap and base part in the circumferential direction, are formed by additional, radial projections and recesses which are arranged alternately on both parts and are formed to a limited extent in the circumferential direction.

In accordance with another feature of the invention, the holding means of the cap is provided with a resilient protrusion, and the support of the base part is formed with a complementary notch or groove, for automatically fastening the cap to the base part in a mounting position.

Moreover, for the further configuration of the optical properties of the component or merely for the purpose of protecting the semiconductor chip, the production method may include a step of placing a lens covering or lens-shaped chip covering between the base part and the cap. That lens covering may be produced from a light-transmitting plastic material which, in particular, has an optical filter material.

Furthermore, the base part may be produced from a plastic material which increases the absorption of incident scattered light. In particular, the base material may be colored with a black coloring substance. The shaping of the base part produced from plastic may be chosen such that in addition to the suitability for fastening the cap, a reflector is formed around the semiconductor chip and the optical properties of the component are concomitantly determined in a favorable manner. Furthermore, a reflector assigned to the semiconductor chip may be provided inside the base part for the purpose of improving the radiation properties of the component.

The form of the lens integrated in the cap produced from plastic may be of variable configuration, in a simple and cost-effective manner, depending on desired optical properties of the component. Thus, for example, the cap may have an integrated Fresnel lens, with the result that optoelectronic components having a particularly small structural height and very narrow-angled radiation and/or reception characteristics can advantageously be realized.

In total, the production method according to the invention enables the optical system of the component to be configured in a very differentiated and precise manner.

In accordance with yet another feature of the invention, the production of the base part is from plastic materials which are high-temperature-resistant, soldering-resistant and with which the chip carrier and the soldering connections or electrode terminals are encapsulated by injection molding. The plastic material may in this case be, in particular, a thermoplastic, such as, for example, LCP= liquid crystal polymers, PPA=polyphthalamide, or polysulfone or similar material. Furthermore, thermosetting plastic materials are also possible as the plastic material of the base part; they will generally be more expensive than thermoplastics and are probably less suitable for high-temperature applications.

The material of the cap which integrally comprises the lens of the component may be, for example, a polycarbonate material which may be optically clear and thus fully transparent, or, for the purposes of filtering light of a specific wavelength, may be colored or provided with specific absorptive materials.

The material of the lens covering or lens-shaped chip covering above the semiconductor chip may preferably be resin or silicone.

Other features which are considered as characteristic for the invention are set forth in the appended claims.

Although the invention is illustrated and described herein as embodied in a method of producing an optoelectronic semiconductor component it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a diagrammatic view of a chip carrier strip for producing an optoelectronic semiconductor component in accordance with the invention.

DESCRIPTION OF THE PREFERRED EMBODIMENTS

Figure 1:
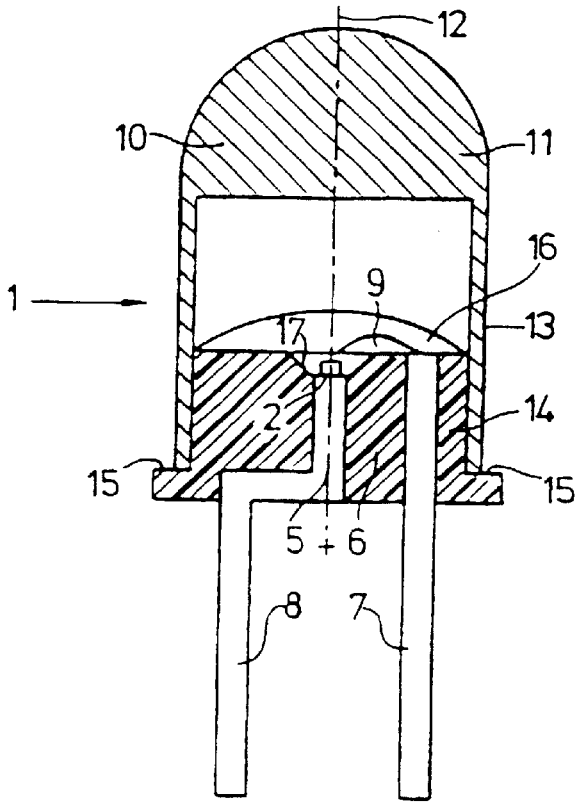
FIG. 1 is a diagrammatic sectional view of an optoelectronic semiconductor component in accordance with an exemplary embodiment of the invention.
Figure 2A:
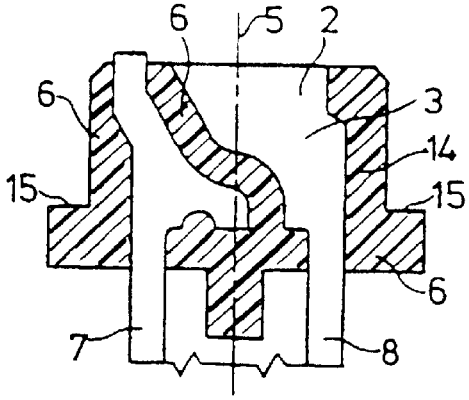
FIG. 2A is a diagrammatic sectional view of a base part and of a chip carrier in an optoelectronic semiconductor component in accordance with a further exemplary embodiment of the invention.
Figure 2B:
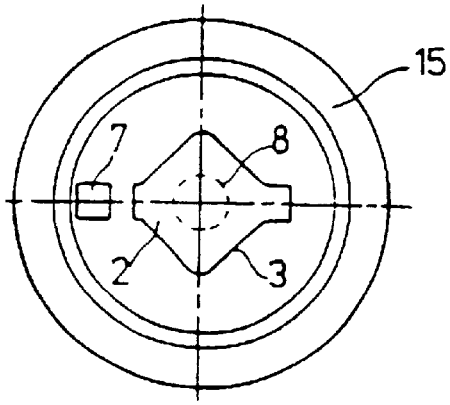
FIG. 2B is a diagrammatic plan view thereof.

Referring now to the figures of the drawing in detail, there is seen as optoelectronic semiconductor component 1, having a chip carrier 3 with an approximately planar chip carrier surface 2. An optoelectronic semiconductor chip 4 is fastened on the carrier surface 2 with predetermined alignment of its optical axis 5. The component further includes a base part 6, which is assigned to the chip carrier 3, supports the latter and produced from a plastic material. The optoelectronic semiconductor chip 4 is electrically conductively connected to two electrode terminals 7 and 8 routed through the base part 6. In FIG. 1, a contact wire 9 connects the semiconductor chip 4 to one electrode terminal 7, and the electrical connection to the other electrode terminal 8 is effected by a bonded connection of the electrically conductive underside of the semiconductor chip 4 to the chip carrier surface 2. The latter is integrally formed with the other electrode terminal 8. The lens 10 provided for optical imaging of the semiconductor chip 4 forms a part of an independently configured cap 11. The cap 11 is preferably produced from polycarbonate and is placed onto the base part 6 in such a way that the optical axis 12 of the lens 10 coincides with the optical axis 5 of the semiconductor chip 4 disposed on the chip carrier 3.

The cap 11 has a holding means 13 which forms a positively locking mechanical form-lock connection with a support 14 of the base part 6. When the cap 11 is placed onto the base part 6, the holding means 13 and the support 14 engage with one another. The cap 11 and the base part 6 have an essentially cylindrically symmetrical cross-sectional shape whose axes of cylinder symmetry run concentrically with respect to one another and also coincide with the optical axes 5 and 12 of the lens 10 and the semiconductor chip 4.

In the embodiment of FIG. 1, the inner diameter of the holding means 13 is approximately identical to the external diameter of the support 14. The holding means 13 and the support 14 are matched and thus form a positively locking connection. For defined support of the cap 11 on the base part 6, the support 14 of the base part 6 has, on its outer circumference, a peripheral abutment surface 15, which supports the holding means 13 of the cap 11. As a result, when the cap 11 and the base part 6 are joined, they are automatically positioned with respect to one another in such a way that a stable, substantially play-free symmetry position of cap 11 and base part 6 is ensured. The optoelectronic component 1 according to the invention thus has extremely small adjustment tolerances and resultant optical squint angles, and is thus particularly suitable for applications having very narrow radiation and/or reception characteristics.

A protective or lens covering 16, which is composed of resin or silicone and is fastened between the base part 6 and the cap 11, covers the semiconductor chip 4.

The reference symbol 17 indicates a reflector formed in the base part 6. The reflector 17 is assigned to the semiconductor chip 4 and concomitantly determines the radiation and/or reception characteristic of the component.

Figure 3A:
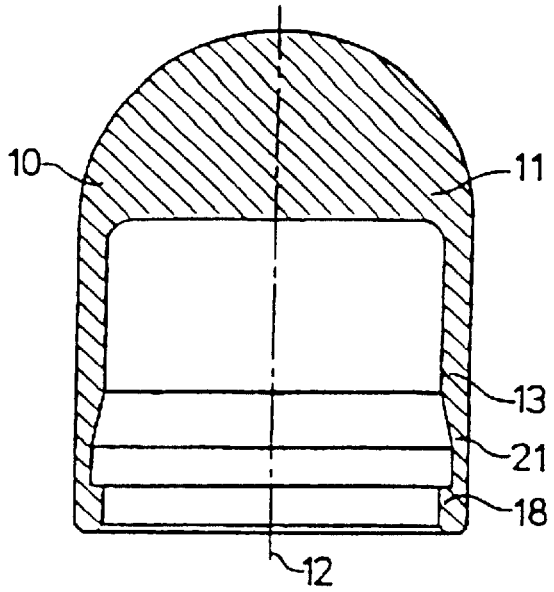
FIG. 3A is a sectional view of a cap with integrated lens of an optoelectronic semiconductor component in accordance with a further exemplary embodiment of the invention.
Figure 3B:
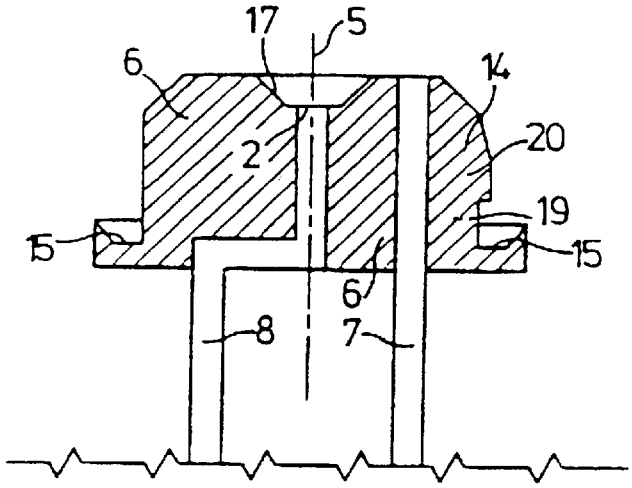
FIG. 3B is a diagrammatic sectional view of a base part in accordance with the further exemplary embodiment of the invention.
Figure 3C:
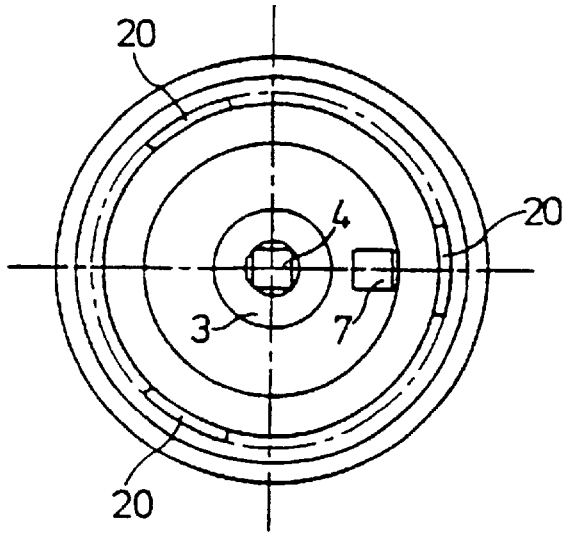
FIG. 3C is a plan view thereof.

In the exemplary embodiment of the invention illustrated in FIG. 1, the permanent stable fastening of the cap 11 placed onto the base part 6 can be effected by a bonded connection or welded connection. In contrast, FIGS. 3A to 3C show a further exemplary embodiment of an optoelectronic component, in which the cap 11 can be snapped onto the base part 6 for automatic establishment of a permanent and secure fastening by a snap-action closure. For this purpose, the holding means 13 of the cap 11 is provided with a resilient protrusion 18, which interacts with an undercut notch 19, provided in the support 14 of the base part 6, for the automatic establishment of the cap 11 and of the base part 6 in a mounted position.

Further features which assist in a reliable, automatic positioning when the cap 11 and base part 6 are joined together are evident in the exemplary embodiment of FIGS. 3A to 3C. For example, projections 20 and depressions 21 are assigned to the positively locking mechanical connection of the cap 11 and the base part 6. That connection can be released in the axial direction. The projections 20 and depressions 21 are formed on both parts of holding means 13 and support 14 peripherally or to a limited extent in the circumferential direction.

The novel method of producing the optoelectronic semiconductor component 1 in accordance with a preferred exemplary embodiment will now be explained in more detail. Production proceeds from a chip carrier strip 22 illustrated according to FIG. 4. The strip can be produced and processed in endless continuous production (reel-to-reel technique). Firstly, the chip carrier surfaces 2 to which the semiconductor chips 4 are to be fastened are produced in an embossing step for producing smooth and clean surfaces. Afterward, the regions of the chip carriers 3 and electrode terminals 7 and 8 are subjected to an electrodeposition process. There, for example, nickel is first applied and then silver. As the next production step, the base part 6 is then produced by encapsulating the chip carrier 3 and the electrode terminals 7 and 8 by injection molding with a thermoplastic material. In this case, the thermoplastic material is introduced under pressure into an injection mold, which has the desired, predetermined configuration of the base part, in order to avoid the formation of shrink holes and inclusions. Afterward, the semiconductor chip 4 is fastened on the chip carrier surface 2 by bonding. Adhesive bonding is particularly suitable. If appropriate, bonding wires for contacting the semiconductor chip 4 are connected to an electrode terminal. After this production step, it is possible, still on the endless chip carrier strip 22, to produce, for the purpose of protecting or configuring the optical system, a lens covering 16 by injection molding of a suitable plastic material that is light-transmitting or provided with a filter material, which lens covering covers the semiconductor chip 4. Subsequently, after the individual chip carriers 3 with formed base part 6 and applied chip covering 16 have been separated from the chip carrier strip 22, the independently formed cap 11 produced from polycarbonate with an integrated lens 10 is placed onto the base part 6 in such a way that the cap 11 and the base part 6 are automatically positioned with respect to one another such that the optical axes 5 and 12 coincide.

We claim:

1. A method of producing an optoelectronic semiconductor component, which comprises:

providing a chip carrier strip with a multiplicity of successively arranged chip carriers each having a substantially planar chip carrier surface, injection-molding a base part around an individual chip carrier of the multiplicity of chip carriers on the chip carrier strip and at least two electrode terminals extending through the base part;

fastening an optoelectronic semiconductor chip with a given optical axis on the chip carrier surface of the chip carrier;

contacting the optoelectronic semiconductor chip with the at least two electrode terminals extending through the base part;

providing an independent cap produced from a plastic material and having a lens with an optical axis, and placing the independent cap on the base part such that the cap and the base part are automatically positioned with respect to one another such that the optical axis of the lens and the optical axis of the semiconductor chip substantially coincide; and permanently fastening the cap to the base part.

2. The method according to claim 1, wherein the step of providing the independent cap comprises producing the cap as a separate structural part in an injection molding operation.

3. The method according to claim 1, which further comprises producing a lens covering between the base part and the cap, the lens covering the semiconductor chip.

4. The method according to claim 1, which comprises separating an individual optoelectronic semiconductor component from the chip carrier strip only subsequently to the steps of injection-molding, fastening the semiconductor chip on the chip carrier surface, and contacting the semiconductor chip with the electrode terminals.

5. The method according to claim 1, which comprises providing the cap with a holding means and positively locking the holding means to a support of the base part by placing the cap onto the base part and mutually engaging the holding means and the support, and forming the holding means and the support such that when the cap is placed onto the base part the optical axes of the lens and the semiconductor chip are automatically aligned with one another.

6. The method according to claim 5, wherein the cap and the base part have a substantially cylindrical symmetrical cross-sectional shape having mutually concentric axes of symmetry coinciding with the optical axes of the lens and the semiconductor chip.

7. The method according to claim 5, which comprises forming the holding means of the cap and the support of the base part with positively form-locking elements.

8. The method according to claim 5, which comprises forming the holding means and the support such that when the cap and the base part are joined, the holding means and the support are automatically positioned with respect to one another to ensure a stable, substantially play-free symmetrical position of the cap and the base part.

9. The method according to claim 5, which comprises forming a peripheral abutment surface on an outer circumference of the support and supporting the holding means of the cap with the peripheral abutment surface.

10. The method according to claim 5, which comprises forming projections and grooved recesses peripherally about the holding means and the support for positively, and axially releasably, locking the cap to the base part.

11. The method according to claim 5, which comprises forming circumferentially limited radial projections and recesses alternately on the holding means and the support for mutual alignment of the cap and the base part in the circumferential direction.

12. The method according to claim 5, forming a resilient protrusion on the holding means of the cap, and forming the support of the base part with a notch, the protrusion and the notch automatically engaging into one another when the cap is mounted on the base part.

13. The method according to claim 1, wherein the injection molding step comprises forming the base part from a high-temperature plastic.

14. The method according to claim 1, which comprises forming the base part from a thermoplastic.

15. The method according to claim 14, wherein the base part is formed from a thermoplastic selected from the group consisting of liquid crystal polymers, polyphthalamide, and polysulfone.

16. The method according to claim 3, wherein the step of producing the lens covering comprising producing the lens from a light-transmitting plastic material.

17. The method according to claim 3, wherein the step of producing the lens covering comprising producing the lens from a light-transmitting plastic material with an optical filter material.

18. The method according to claim 1, wherein the base part is produced from plastic with a material for increasing an absorption of incident scattered light.

19. The method according to claim 18, which further comprises coloring the plastic material of the base part with a black coloring substance.

20. The method according to claim 1, which further comprises placing a reflector assigned to the semiconductor chip inside the base part.

* * * * *